United States Patent
Chung

(10) Patent No.: US 6,560,739 B1
(45) Date of Patent: *May 6, 2003

(54) MECHANISM FOR ENABLING COMPLIANCE WITH THE IEEE STANDARD 1149.1 FOR BOUNDARY-SCAN DESIGNS AND TESTS

(75) Inventor: Sung Soo Chung, San Jose, CA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/185,166

(22) Filed: Jun. 27, 2002

Related U.S. Application Data

(63) Continuation of application No. 09/152,940, filed on Sep. 14, 1998, now Pat. No. 6,446,230.

(51) Int. Cl.$^7$ .............................................. G01R 31/28
(52) U.S. Cl. ...................................... 714/726; 714/727
(58) Field of Search ............................... 714/726, 727, 714/724, 729, 731, 732, 733, 725, 738, 30, 39; 703/16; 716/5, 18

(56) References Cited

U.S. PATENT DOCUMENTS

| | | | |
|---|---|---|---|
| 4,161,719 A | 7/1979 | Parikh et al. | 375/365 |
| 4,397,020 A | 8/1983 | Howson | 370/510 |
| RE33,900 E | 4/1992 | Howson | 370/514 |
| 5,199,049 A | 3/1993 | Wilson | 375/351 |
| 5,281,864 A | 1/1994 | Hahn et al. | 327/202 |
| 5,490,151 A | 2/1996 | Feger et al. | 714/727 |
| 5,497,378 A | 3/1996 | Amini et al. | 714/727 |
| 5,602,855 A | 2/1997 | Whetsel, Jr. | 714/726 |
| 5,623,503 A | 4/1997 | Rutkowski | 714/726 |
| 5,706,297 A | 1/1998 | Jeppesen, III et al. | 714/30 |
| 5,708,773 A | 1/1998 | Jeppesen, III et al. | 714/30 |
| 5,983,377 A | 11/1999 | Knotts | 714/726 |
| 5,991,909 A | 11/1999 | Rajski et al. | 714/729 |
| 6,195,774 B1 | 2/2001 | Jacobson | 714/727 |
| 6,446,230 B1 * | 9/2002 | Chung | 714/726 |

* cited by examiner

Primary Examiner—Emmanuel L. Moise
(74) Attorney, Agent, or Firm—Thelen Reid & Priest LLP; Marc S. Hanish

(57) ABSTRACT

A mechanism for enabling compliance with the IEEE boundary-scan standard 1149.1 includes, in a first preferred embodiment, a compliance enabler working with non-compliant embedded boundary-scan cells to enable a Device Under Test (DUT) to function as an IEEE-standard-compliant part, thus allowing full utilization of existing test tool generation and operation of the IEEE standard. The enabler is preferably provided separately from boundary scan-cells embedded in core logic designs. The enabler includes a Test Access Port (TAP) controller and related decoding circuits to generate necessary compliance signals based on various conventional TAP controller variables and instruction functions. The embedded boundary-scan cells preferably include an internal scan cell architecture. In a second embodiment, a second enabler works with a TAP emulator to allow testing of TAP-less DUTs.

40 Claims, 12 Drawing Sheets

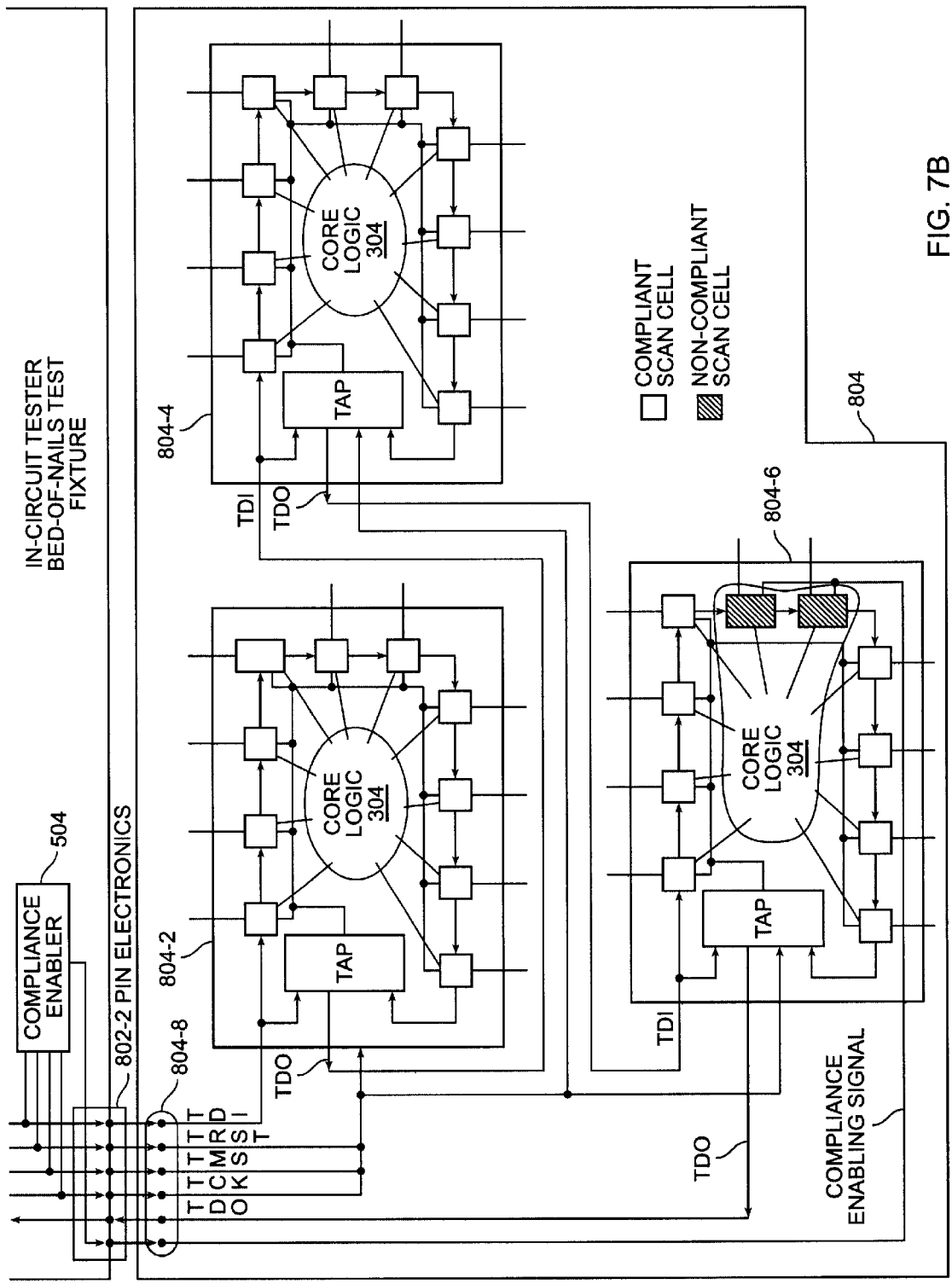

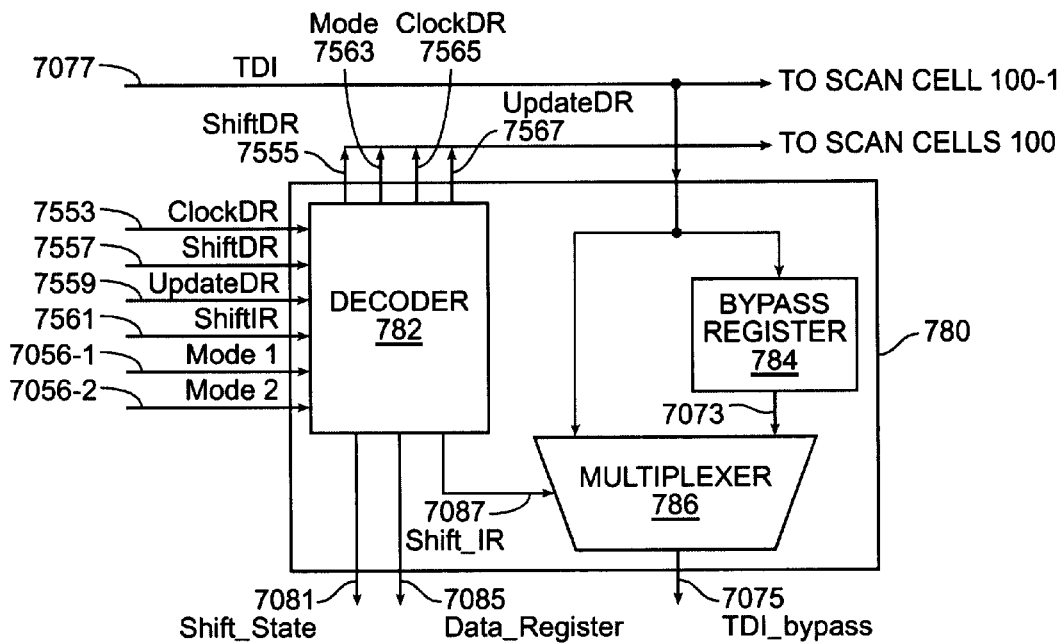
FIG. 8C
| Instruction | OP Code | Mode 1 | Mode 2 | Selected TDO |
|---|---|---|---|---|
| USER MODE | 10 | 1 | 0 | User Defined |
| BYPASS (or TAP RESET) | 11 | 1 | 1 | Bypass Register |
| SAMPLE/PRELOAD | 01 | 0 | 1 | Data Register |
| EXTEST | 00 | 0 | 0 | Data Register |
FIG. 8D
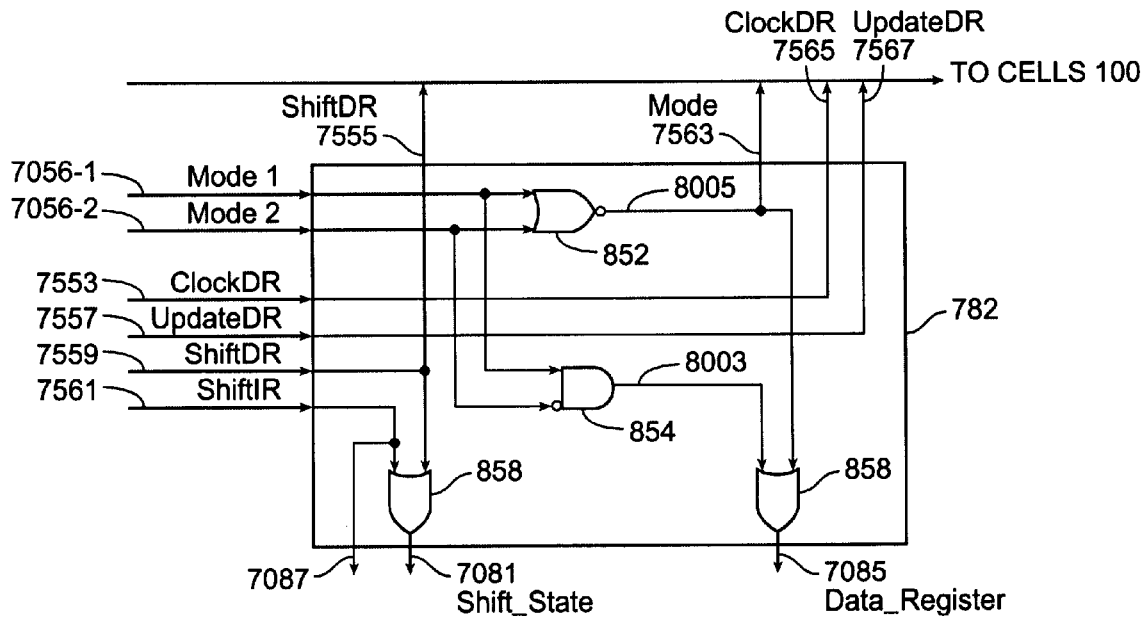
FIG. 8E

MECHANISM FOR ENABLING COMPLIANCE WITH THE IEEE STANDARD 1149.1 FOR BOUNDARY-SCAN DESIGNS AND TESTS

CROSS-REFERENCE TO RELATED APPLICATION

This application is a continuation of application Ser. No. 09/152,940, entitled "Mechanism for Enabling Compliance with the IEEE Standard 1149.1 for Boundary-Scan Designs and Tests" by Sung Soo Chung, filed on Sep. 14, 1998 now U.S. Pat. No. 6,446,230.

BACKGROUND OF THE INVENTION

1. Technical Field

This invention relates generally to testing integrated circuits (ICs), and more particularly to testing according to the Institute of Electrical and Electronics Engineers (IEEE) standard 1149.1.

2. Discussion of Background Art

Testing of integrated circuit devices or components is facilitated by providing each input and output (I/O) pin of the devices with a boundary-scan cell which enables using boundary-scan techniques to control and observe signals at the device boundaries. The IEEE standard 1149.1 specifies a boundary-scan architecture and a protocol which defines test logic that can be used with ICs in a standardized approach to testing the IC and interconnections between IC components when assembled on a printed circuit board or other substrate to form a product. The IEEE standard 1149.1 also allows observing or modifying circuit activity during otherwise normal operation of the circuit. Additionally, the defined test logic can access other design-for-test features built into a device (IEEE standard 1149.1 - 1990, pages 1—1 and 1–5). The standard is intended to confirm 1) that each device or component performs its required function, 2) that components are interconnected correctly, and 3) that components interact correctly and that the product performs its intended function.

In general, the test circuitry defined by the standard allows feeding test instructions and associated test data into a component, and subsequently allows reading out results of the execution of such instructions. All instructions, test data, and test results are communicated in a serial format. Starting from an initial state in which the defined test circuitry is inactive, a typical test sequence is as follows: 1) serially load the component with the instruction codes for the particular test to be performed, 2) execute the selected test and 3) shift data out of the component to or through the bus master and examine test results (Id., pages 1–2).

FIG. 1 shows a conventional scan cell 100, including two multiplexers 102 and 108, a capture cell 104, and an update cell 106. Input signals to cell 100 include signal_input, serial_input, shift_dr, shift_clk, update_clk and mode. Output signals include signal_output and serial_output. Depending on the control signals (shift_dr and mode) applied to lines 1014 and 1016 to multiplexers 102 and 108, data (signal_input) can be either loaded through lines 1003 and 1004 into capture cell 104 or driven through line 1006 and multiplexer 108 to signal output on line 1012. Signals which have arrived through lines 1003, 1004, and 1008 are held by update cell 106 at line 1010 while new serial input data is shifted through lines 1002, 1004, and 1008 to the serial output of cell 100 and on to the serial_input of another cell 100 (not shown).

FIG. 2 shows an example of three prior art connected scan cells 100A, 100B, and 100C to illustrate how data is shifted and output for observations. The cell 100A serial output line 1008A is connected to the cell 100B serial input line 1002B. Similarly, the cell 100B serial_output line 1008B is connected to the cell 100C serial_input line 1002C. Cells 100A, 100B, and 100C have update_clk and shift_clk signals connected together (not shown). Appropriate control signals applied to multiplexers 102 and clocking signals applied to capture cells 104 will shift serial data input from serial input line 1002A of cell 100A to lines 1008A, 1008B, and 1008C. When ready for observation, the data on lines 1008A, 1008B, and 1008C are clocked through the respective flip-flops 106A, 106B, and 106C to lines 1010A, 1010B, and 1010C to appear on lines 1012A, 1012B, and 1012C, respectively.

FIG. 3 shows a prior art device 300 complying with the IEEE standard 1149.1. Device 300 includes an IEEE standard 1149.1 Test Access Port (TAP) controller 306, and multiple scan cells 100, each associated with an input, output or I/O pin 302, interconnected to form a shift register chain around the border of the core logic 304. TAP controller 306 is a synchronous state machine and a general-purpose port that, in conjunction with boundary scan cells 100 and through five signals Test Clock (TCK), Test Reset Input (TRST), Test Mode Select (TMS), Test Data Input (TDI) and Test Data Output (TDO), provides signals and access to support the IEEE standard 1149.1 boundary-scan functions. Signal TDI provides test instructions and data. Signal TDO provides the serial output of test instructions and data. Signal TRST provides for asynchronous initialization of TAP controller 306. Signals TCK and TMS cause TAP controller 306 to control the sequence of operations of the defined test circuitry, and to generate clock and control signals as needed for the instruction and test data and for other parts of the test logic architecture. The IEEE standard 1149.1 describes signals TCK, TRST, TMS, TDI, and TDO in detail.

The boundary scan chain comprising cells 100 receives serial input signal TDI at the serial_input (FIG. 1) terminal and produces output signal TDO at the serial_output terminal. Signals TMS, TRST, and TCK through TAP controller 306, generate the other FIG. 1 signals (shift_clk, update_clk, shift_dr, and mode).

FIGS. 4A–C show prior art examples of different interconnections of multiple scan devices 100 that comply with the IEEE standard 1149.1. FIG. 4A shows a serial connection of devices 100 using one TMS and one TCK signal; FIG. 4B shows devices 100 connected in series in two chains connected in parallel using two TMS signals and a TCK signal; and FIG. 4C shows multiple independent paths using common TMS and TCK signals.

The IEEEE standard 1149.1 (1994) defines a Boundary-Scan Description Language (BSDL) for describing testing information, which is input to an automated process with little or no manual interaction for generating a test program.

Objectionably, multiplexer 108 in scan cell 100 (FIG. 1) causes undesirable propagation delay in the functional signal path, especially in high-speed (above 200 Mhz clock) or timing-critical Application-Specific Integrated Circuit (ASIC) devices. Various solutions have emerged to deal with high-speed boundary-scan designs. One solution uses performance-optimized "hard macros," or commonly used logic design functional blocks, in boundary scan cells. The hard macros are constituted of logic elements (AND OR gates, etc.) that are physically close to one another and permit short connecting line delays. However, ASIC designers in many cases do not have access to the desired hard macros, and creating these hard macros requires additional time, resources, and indepth knowledge of a device technology.

Instead of hard macros, ASIC designers can use a standard ASIC library of a vendor's logic components in a "soft macro" approach to synthesize boundary-scan cells. However, this software synthesis approach adds routing delay between "soft macro" components, introduces, in the boundary-scan cells, longer overall delay than the "hard macro" approach, and causes additional delay in the critical signal path, thereby encountering the same problem that is supposed to be solved. Consequently, this software approach is unacceptable for high-speed designs. Additionally, meeting the requirements of the boundary-scan standard in timing-critical and high-speed ASIC designs may be impractical because design time, resources, and device performance overhead costs are too high.

Another solution to testing high speed ASICs omits certain signals and/or functions of the boundary-scan standard in order to reduce performance overhead. However, this solution leaves "holes" or incomplete pin fault coverage for a Device Under Test (DUT). In cases where there is a need to test the uncovered pins, it is often impossible to add non-boundary scan-based test vectors to test those pins.

Another approach leaves to test engineers the problem of modifying test vectors generated by Automated Test Equipment (ATE) to cover untested pins in a scan chain. However, modification or design of custom test vectors requires additional ATE test generation and conversion time.

In light of the deficiencies of the prior art, what is needed is a boundary-scan architecture for testing high-speed ASICs, coreware modules, and certain classes of devices that have limited design sizes, using existing ATE tools without modifications and yet complying with the IEEE standard 1149.1. It is thus desirable that such an architecture reduce design time, device performance overhead, and resources. It is also desirable to have an architecture that eliminates manual interaction during generation of test programs.

SUMMARY OF THE INVENTION

The present invention provides a mechanism for boundary-scan design and test methodologies applicable to timing-critical high (above 200 MHz) speed clock designs, which complies with the IEEE standard 1149.1.

In a first preferred embodiment, the mechanism includes a compliance-enabling apparatus (an enabler) for providing clocking and other signals necessary to embedded cells which use an internal scan cell architecture and which are non-compliant with the boundary scan standard. The non-compliant cells are "embedded" in their functional logic designs rather than being disposed adjacent the I/O pins as is conventional with IEEE standard boundary-scan techniques.

In a second preferred embodiment, a second enabler works with a Test Access Port emulator to support devices that, due to their size limitations for example, do not include an IEEE standard 1149.1 TAP controller. The provided TAP emulator is about one-tenth the size of, and replaces, the IEEE standard TAP controller. The mechanism thus allows a Device Under Test to function as an IEEE standard 1149.1 compliant part. Consequently, existing test tools for the IEEE boundary-scan standard can be fully utilized with devices incorporating the invention. The invention permits a DUT to vary as follows: 1) the DUT does not have to have an internal TAP controller; 2) the DUT may have a TAP controller and both regular boundary-scan cells and embedded boundary-scan cells; or 3) the device may have only embedded boundary-scan cells with or without a TAP controller. Level Sensitive Scan Design (LSSD) based scan cells can also use the invention.

Benefits gained from the invention include: 1) minimizing propagation delay due to boundary-scan cell functions; 2) reducing gate overhead in standard boundary-scan tests; 3) facilitating support for boundary-scan functions where an embedded coreware circuit's internal scan cells interface directly with the device package I/O pins; 4) enabling ATE tools to fully support tests and test vectors for scan cells that are non-compliant and utilize the embedded-boundary-scan structure; 5) reducing overhead in board designs; 6) the enabler preferably being portable to fully-compliant boundary-scan ATE tools; 7) improving IC testability; 8) improving ASIC performance; 9) meeting all ASIC manufacturing test requirements; 10) reducing In-Circuit Test (ICT) development time; and 11) improving tester correlation and program reliability.

BRIEF DESCRIPTION OF THE DRAWINGS

FIG. 7B shows exemplary chips utilizing the invention and the In-Circuit Test interface;

FIG. 8C shows a preferred embodiment FIG. 8A TAP emulator;

FIG. 8D shows a table of mode coding;

FIG. 8E shows details of a FIG. 8C decoder; and

DETAIL DESCRIPTION OF THE PREFERRED EMBODIMENT

The present invention, in a first preferred embodiment, allows designing components with a non-compliant embedded boundary-scan cell structure while meeting all requirements of the IEEE standard 1149.1. In a second preferred embodiment the invention allows testing of devices that, due to size limitations for example, do not include an IEEE standard 1149.1 TAP controller. The invention thus enables test engineers to generate test vectors using existing both hardware and software tools that comply with the IEEE standard 1149.1. The invention also minimizes signal delay and gate overhead, permits meeting ASIC manufacturing test requirements, and improves IC testability, ASIC performance, ICT development time, and tester correlation and program reliability. LSSD- based scan cells can also use the invention.

Figure 3:
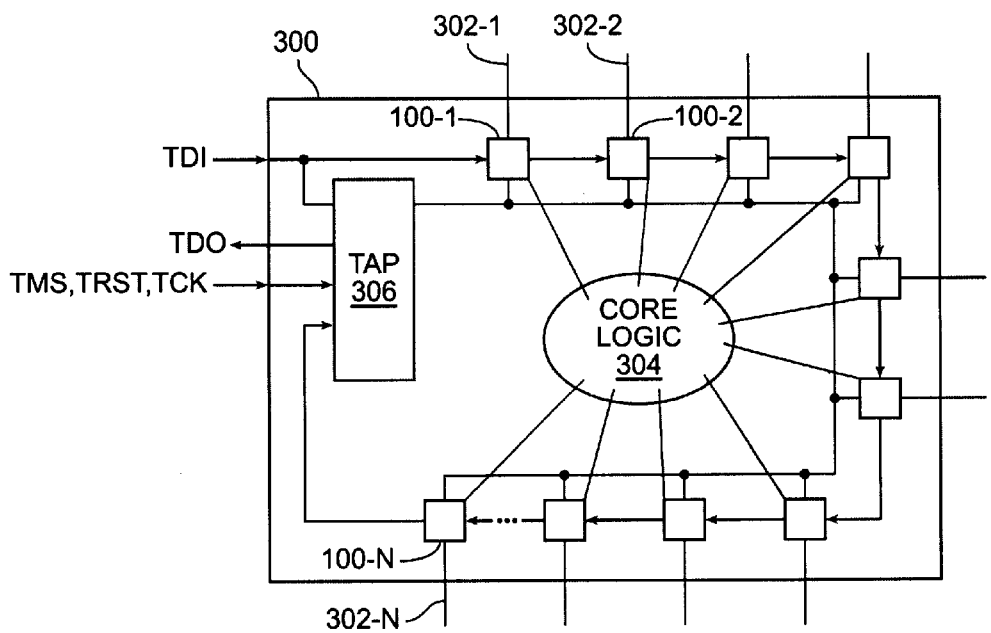
FIG. 3 shows a chip having conventional boundary-scan cells in compliance with the IEEE standard 1149.1.
Figure 2:
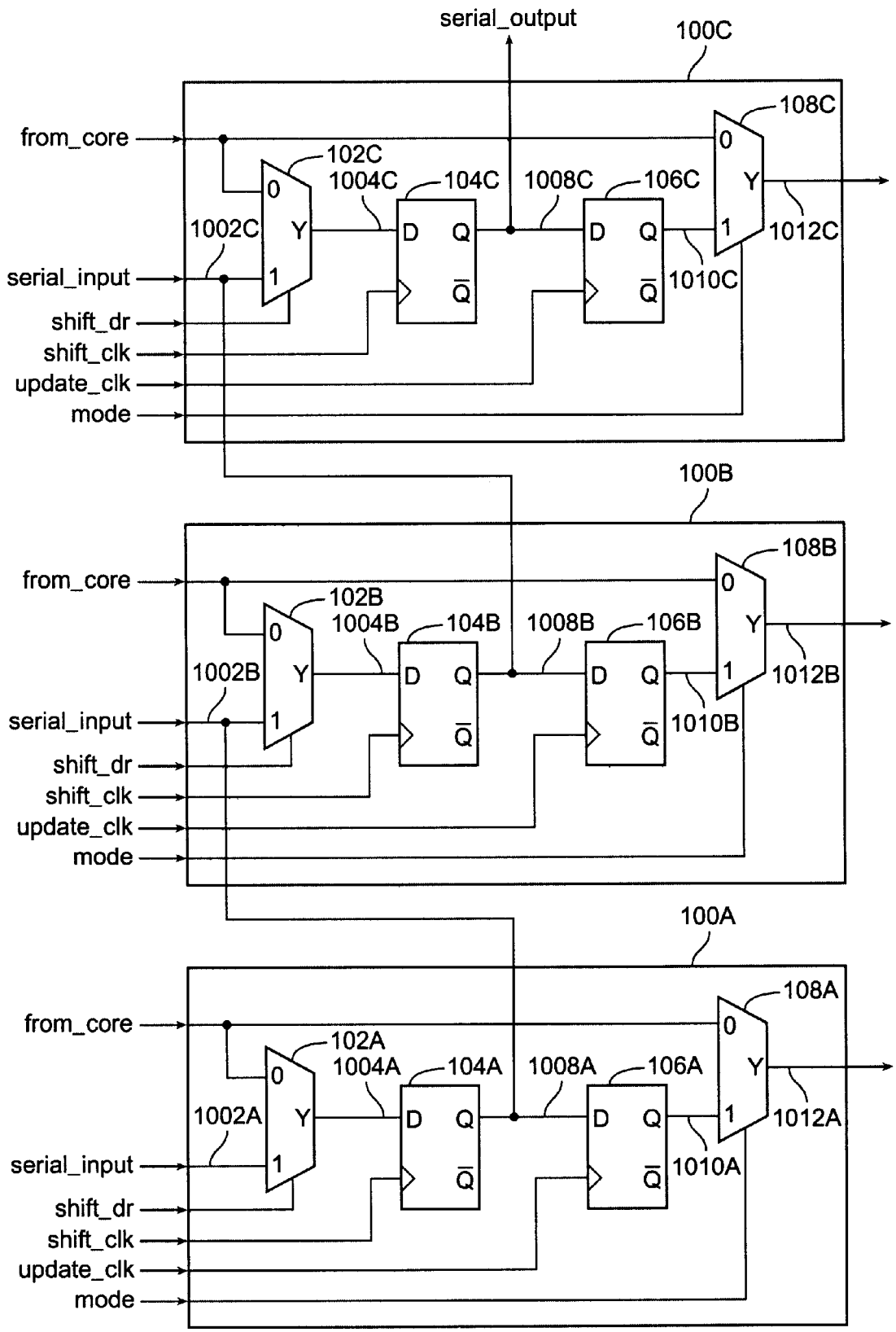
FIG. 2 shows three conventional scan cells connected in a chain.
Figure 4A:
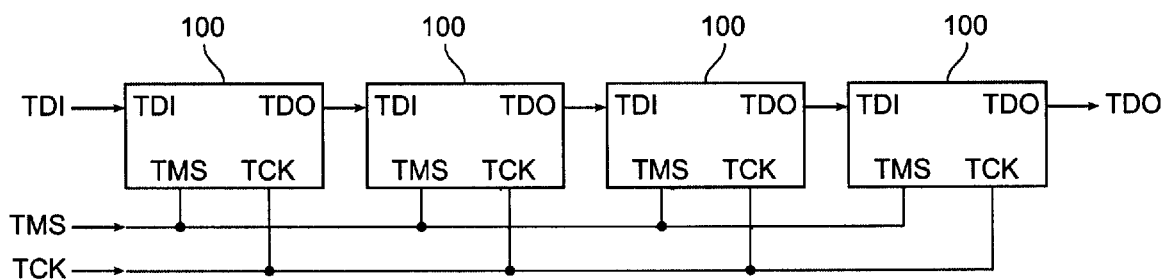
FIG. 4A shows conventional boundary-scan cells connected in series and using one TMS signal and one TCK signal.
Figure 4B:
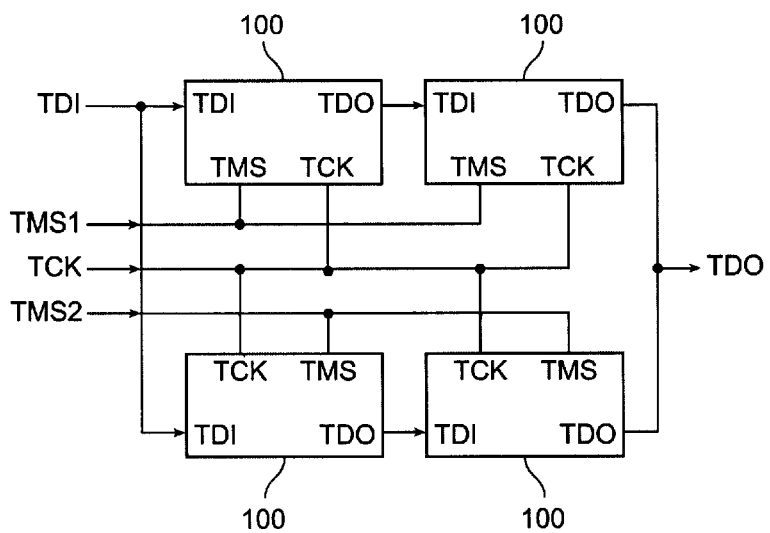
FIG. 4B shows conventional boundary-scan cells connected serially in two chains connected in parallel and using two TSM signals and one TCK signal.
Figure 4C:
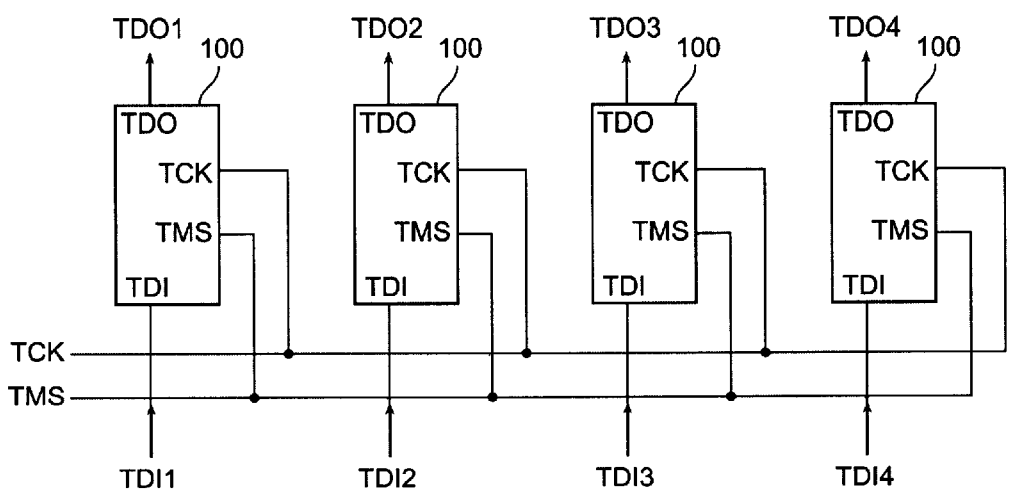
FIG. 4C shows conventional boundary-scan cells using common TMS and TCK signals in independent paths.
Figure 5A:
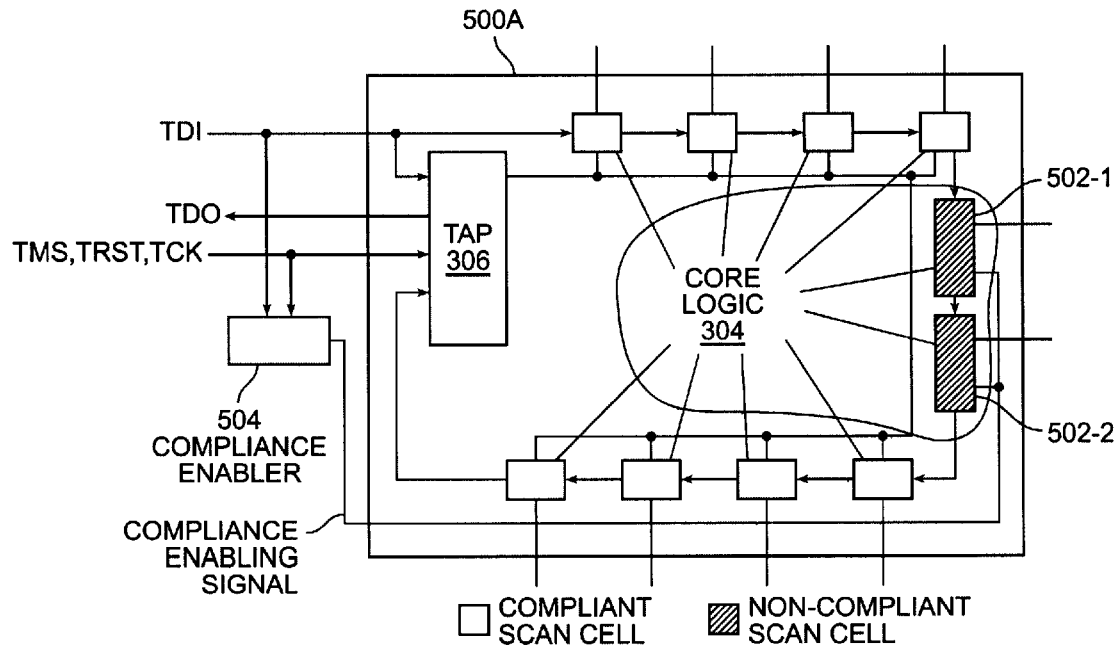
FIG. 5A shows a chip with non-compliant embedded scan cells and the enabler in accordance with the present invention.

FIG. 5A illustrates the invention in a first preferred embodiment as chip 500A, which is similar to FIG. 3 prior art chip 300 except that chip 500A includes two noncompliant scan cells 502-1 and 502-2 and is accompanied by a compliance enabler 504. Non-compliant scan cells 502-1 and 502-2 lack access to the signals and functions of the TAP controller 306 and are referred to as "embedded scan cells" because they are embedded inside, rather than being at the boundary of, the core logic 304.

Compliance enabler 504 generates control and clocking signals necessary for the non-compliant scan cells 502-1 and 502-2 so that all of the boundary-scan functions will be transparent to conventional ATE software and hardware tools used during a boundary-scan test. These signals, distributed to embedded scan cells 502, support the IEEE standard 1149.1 TAP public instructions and functions. Enabler 504, receiving signals TDI, TMS, TRST, and TCK, synchronizes its internal TAP controller 702 (FIG. 7A) with TAP controller 306, and thus allows necessary control signals to be generated based on the states of TAP controller 306. This synchronization permits every DUT in the scan chain to be in the same state (even though instructions in each state may differ for each DUT). In accordance with the invention, chip 500A complies with the IEEE standard 1149.1 as if it were chip 300 of FIG. 3.

Enabler 504, in a preferred embodiment implemented outside of chip 500A as part of a DUT fixture or a TAP access mechanism, reduces overhead in board designs. Enabler 504 is also portable to fully-compliant boundary-scan ATEs, and thus permits ICs to be boundary-scan tested through ICT during board tests.

Figure 5B:
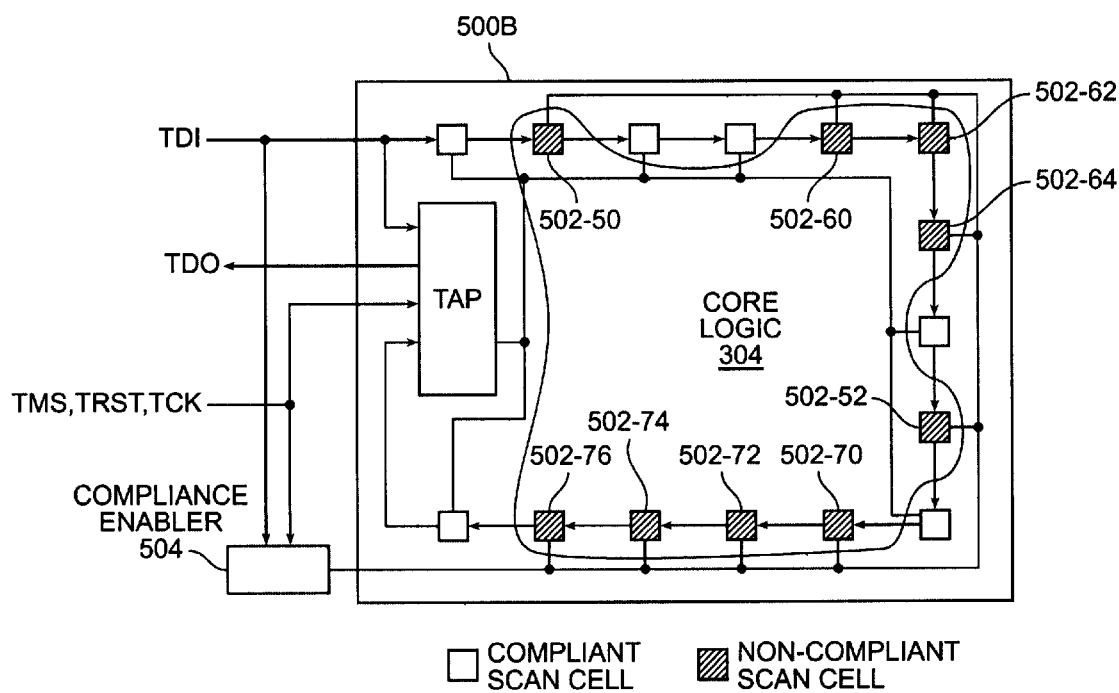
FIG. 5B shows non-compliant embedded cells connected in various ways in core logic.

As illustrated in FIG. 5B one or more scan cells 502 may be embedded at various locations in the core logic 304 of a DUT 500B. For example, cells 502-50 and 502-52 are individually connected in the scan chain; cells 502-60, 502-62, and 502-64 are in a group of three; and cells 502-70, 502-72, 502-74, and 502-76 are in a group of four.

Figure 5C:
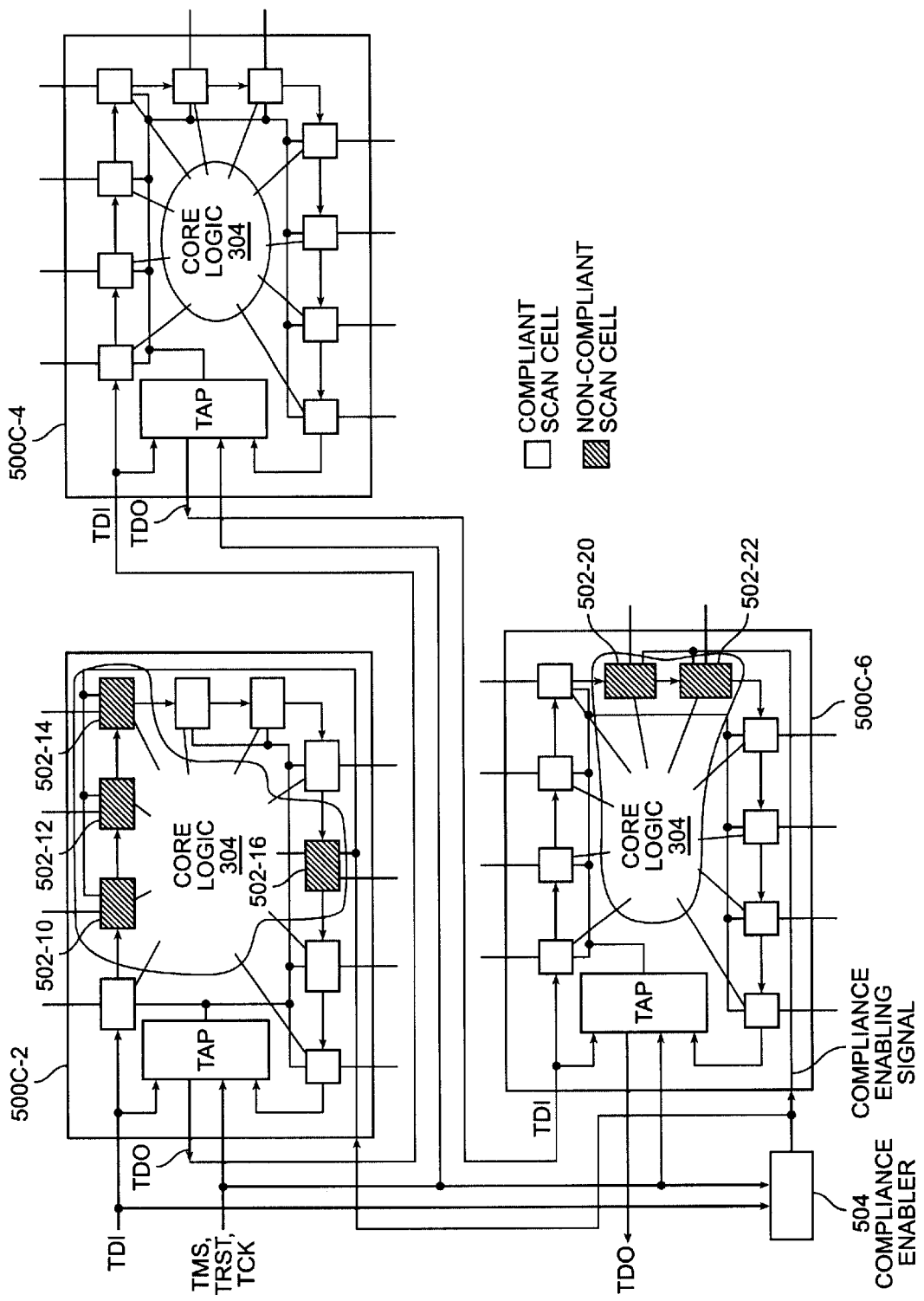
FIG. 5C shows interconnected chips utilizing the invention.

Further in accordance with the invention, more than one non-compliant chip (500A or 500B) may be included in a scan chain and still utilize one compliance enabler 504 so that the entire scan chain is compliant with the IEEE standard 1149.1. FIG. 5C illustrates a scan chain with two non-compliant chips 500C-2 and 500C-6 and one compliant chip 500C4. Chip 500C-2 includes four non-compliant embedded scan cells 502-10, 502-12, 502-14, and 502-16. Chip 500C-6 includes two non-compliant embedded scan cells 502-20 and 502-22.

Figure 6A:
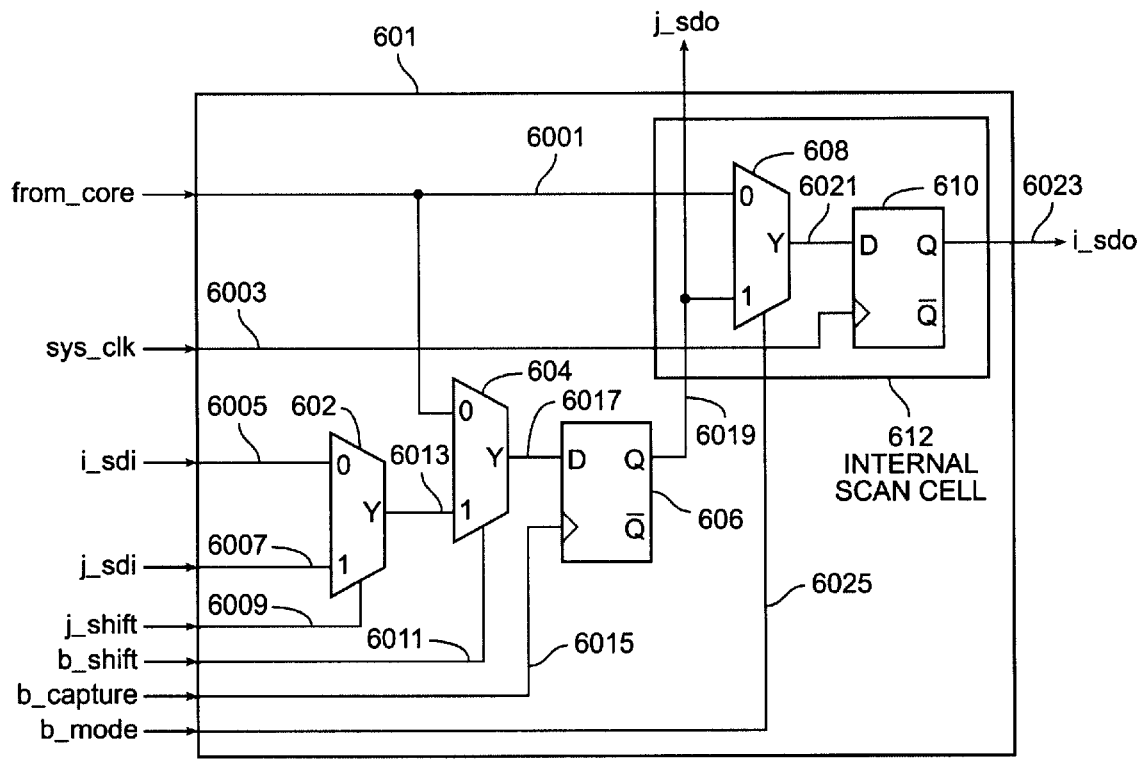
FIG. 6A shows a first preferred embodiment of an embedded scan cell in accordance with the invention.

FIG. 6A shows an embedded scan cell 601, which is a first preferred embodiment of a FIG. 5A cell 502 and includes multiplexers 602, 604 and 608, and flip-flops 606 and 610. Multiplexer 608 and flip-flop 610 form an "internal scan cell" 612, which is for testing and, according to the invention, is normally found inside core logic 304 of a DUT. Where possible, the invention uses internal scan cells 612 to avoid redundant circuitry. In. both FIGS. 6A and 6B, for illustrative purposes, a signal having a prefix i_is preferably received from an internal scan cell structure, a signal having a prefix j_is preferably received in accordance with the IEEE standard 1149.1, and a signal having a prefix b_is preferably received as a signal either from the internal scan cell structure or in accordance with the IEEE standard 1149.1. Cell 601 receives the functional logic signal from_core through line 6001 from core logic 304. Signal sys_clk on line 6003, preferably received from the functional system clock signal, clocks flip-flop 610 during boundary scan testing. Signal i_sdi on line 6005, preferably received from the internal scan cell serial data input, is fed to multiplexer 602. Signal j_sdi on line 6007 serves the same function as the boundary scan serial input (TDI in accordance with the IEEE standard 1149.1 or serial_input of FIG. 1). Signal j_shift on line 6009, preferably received from the TAP controller 306 signal ShiftDR, corresponds to the FIG. 1 signal shift_dr. Signal b_shift on line 6011, preferably received either from the TAP controller 306 signal ShiftDR or internal scan shift control signal, controls multiplexer 604. Signal b_capture on line 6015, preferably received from either the TAP controller 306 signal ClockDR or from the internal scan capture clock signal, clocks capture cell flip-flop 606. Signal b_mode on line 6025, preferably received either as signal TMS of the IEEE standard 1149.1 or as an internal scan cell mode control signal, selects input signals of multiplexer 608. Signal j_sdo on line 6019 provides the boundary scan serial data output (FIG. 1 serial_output or TDO in accordance with the IEEE standard 1149.1). Signal i_sdo on line 6023 provides the internal serial scan data output. Scan sell 601, in accordance with the invention, receives one signal or a combination of signals sys_lk, j_shift and b_capture from enabler 504.

Figure 1:
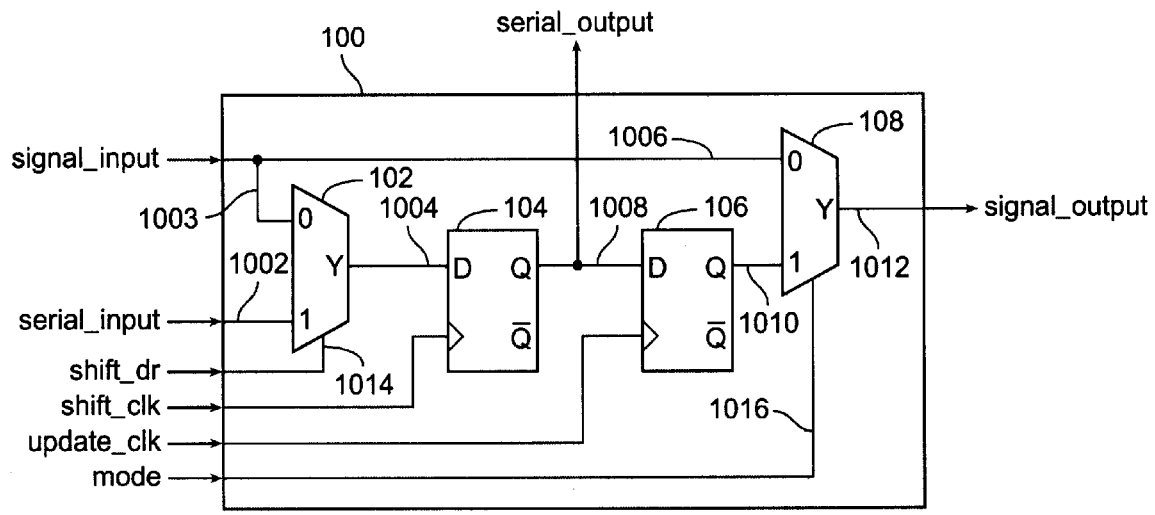
FIG. 1 shows a conventional IEEE standard 1149.1 scan cell.

Internal scan cell 612 acts as a boundary-scan update latch (like flip-flop 106 of FIG. 1) which avoids the delay through multiplexer 108 of FIG. 1 during scan tests. There exists some delay through multiplexer 608, but this delay, as designed, is insignificant compared to the delay through multiplexer 108 because internal scan cell 612 preferably includes speed-optimized hard-macros having optimal signal delay. Additionally, there is no multiplexer delay after a signal arrives at lines 6021 and 6023. Signal sys_clk also provides clocking signals, without delay by other circuits, directly to flip-flop 610.

Figure 6B:
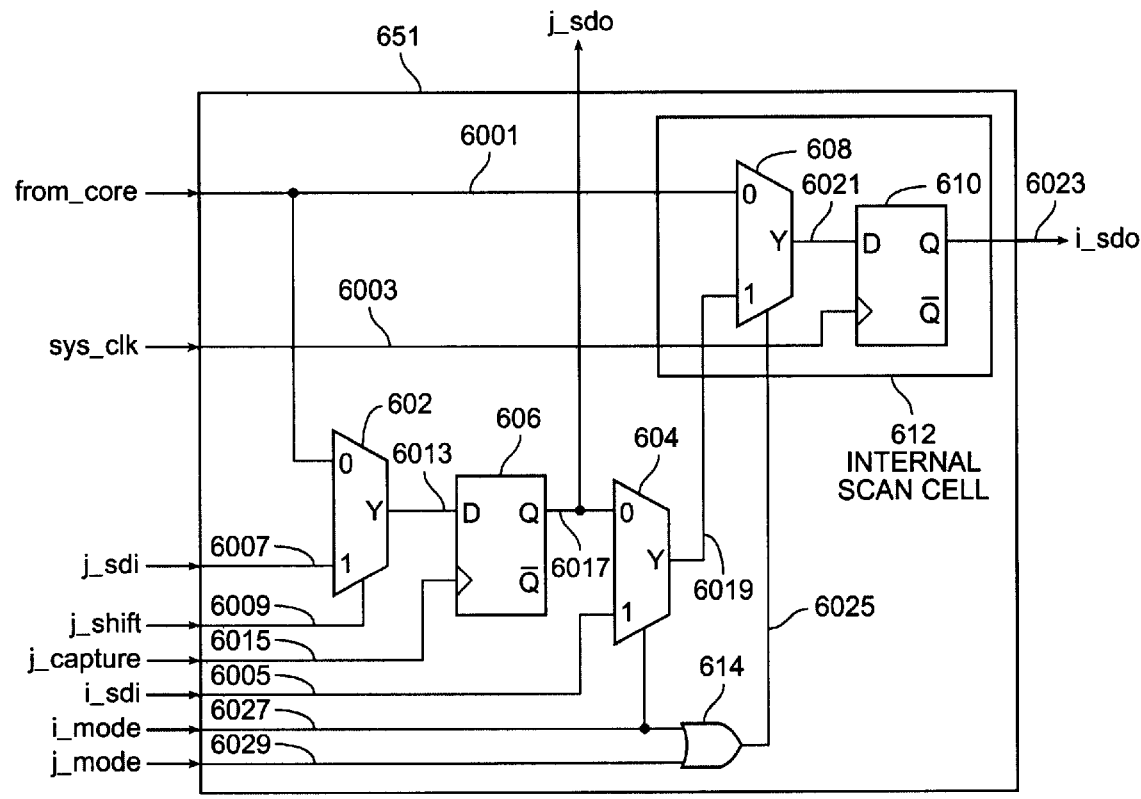
FIG. 6B shows a second preferred embodiment of an embedded scan cell in accordance with the invention.

FIG. 6B shows an embedded scan cell 651, which is a second preferred embodiment of a cell 502. Cell 651, in addition to all of the elements of cell 601, includes an OR gate 614 allowing either signal i_mode on line 6027 or signal j_mode on line 6029 to control multiplexer 608. Those skilled in the art will recognize that the OR gate 614 output signal on line 6025 corresponds to FIG. 6A signal b_mode because signal b_mode, having a prefix b_, may constitute a signal mode control either from the internal scan cell (i_mode) or in accordance with the IEEE standard 1149.1 (j_mode). Additionally, compared to FIG. 6A multiplexer 604 and flip-flop 606 are interchanged to utilize internal scan cell 612 and allow different ways of providing signals to flip-flops 606 and 610. For example, internal scan cell 612 can provide the function of multiplexer 602 and flip-flop 606. Further, signal j_shift on line 6009 selects, for multiplexer 602,. either signal j_sdi or signal from_core, instead of signal j_sdi or signal i_sdi as in FIG. 6A. Signal i_mode replaces signal b_shift to select multiplexer 604 input signals. Signal j_capture replaces signal b_capture to clock flip-flop 606. A user selects either embedded scan cell 601 or 651 to meet the user's system requirements, including speed and signal functions.

Figure 7A:
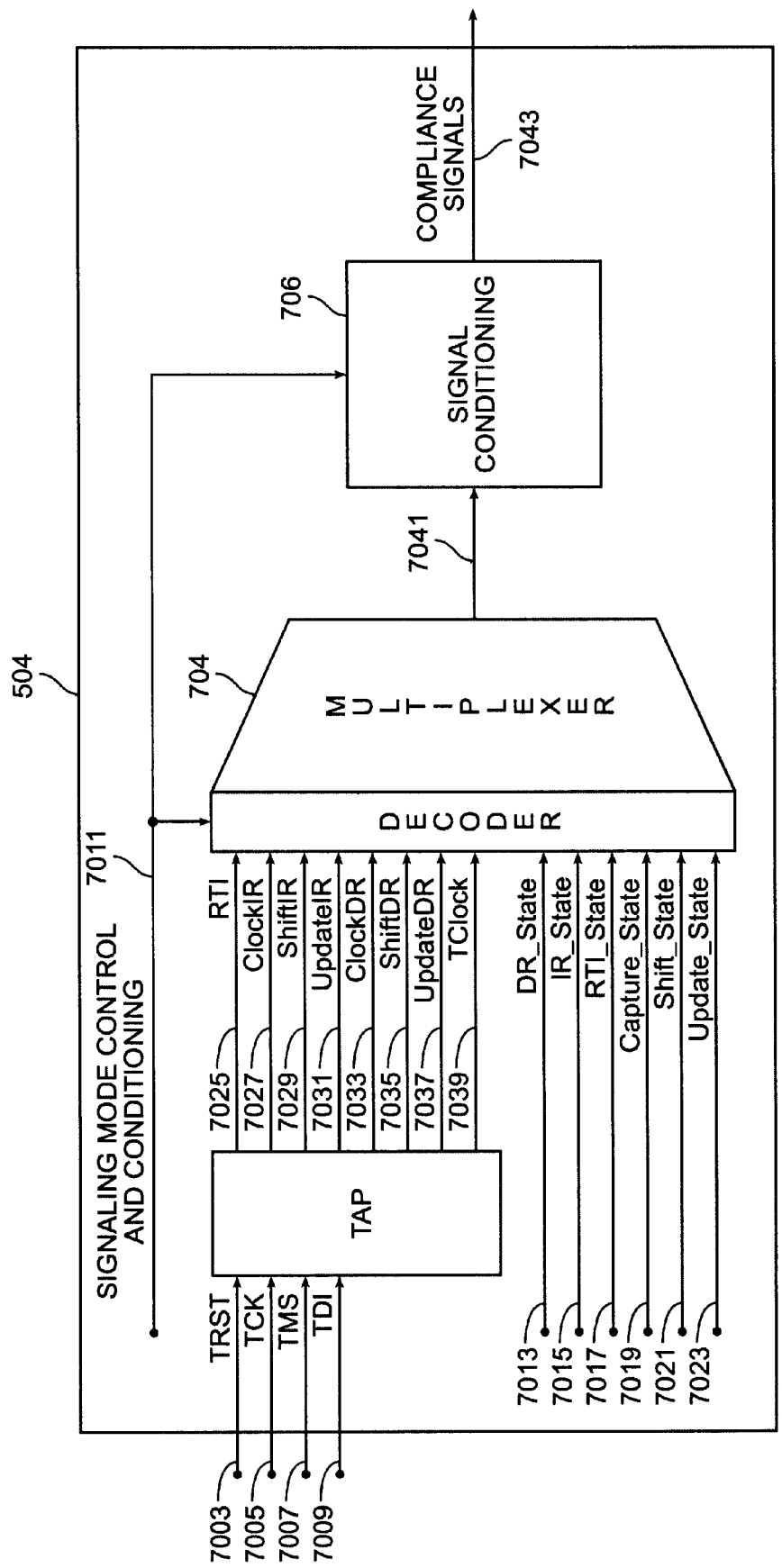
FIG. 7A shows an enabler in accordance with a first preferred embodiment of the invention.

FIG. 7A shows a compliance enabler 504 in accordance with a first preferred embodiment of the invention, which includes a TAP controller 702, a decoder and multiplexer 704, and a signal conditioning circuit 706. In this preferred embodiment, TAP controller 702 preferably performs all functions of a TAP controller 306 as described and complies with the IEEE standard 1149.1. Alternatively, enabler 504 may use a TAP controller 306 to substitute for TAP controller 702. TAP controller 702 has 16 states and provides signals to control the operation of the test data registers (DR), instruction registers (IR), and associated circuitry of the DUT (not shown). Additionally, TAP 702 output signals synchronize the non-compliant scan cells 502 in a DUT because these cells 502 receive the same signals, and thus have the same state, either as shift, instruction, or data, etc. TAP 702, which complies with the IEEE standard 1149.1, receives four common IEEE standard signals: TRST on line 7003, TCK on line 7005, TMS on line 7007, and TDI on line 7009. TAP 702 also provides inputs to decoder and multiplexer 704, including signals RTI on line 7025, ClockiR on line 7027, ShiftIR on line 7029, UpdateIR on line 7031, ClockDR on line 7033, ShiftDR on line 7035, UdateDR on line 7037, and TClock on line 7039. These TAP 702 output signals belong to three DR, IR, and run/test idle (RTI) states defined by the IEEE standard 1149.1. For each IR or DR state there are three signals "clock," "shift," and "update," that form ClockIR, ShiftIR, and UpdateIR for instruction states and ClockDR, ShiftDR, and UpdateDR for data states. TAP 702 provides one output signal or a combination of signals, through decoding and multiplexing (704) and conditioning (706) circuitry, to appear on line 7043 as enabler 504 output signals. Enabler 504 provides DR signals to non-compliant embedded scan cells 502. In one example, enabler 504 provides signals UpdateDR, ShiftDR, and ClockDR for respective signals sys_clk, j_shift, and b_capture of FIG. 6A scan cell 601. In another example, enabler 504 provides the same signals UpdateDR, ShiftDR, and ClockDR for respective signals sys_clk, j_shift, and j_capture of FIG. 6B embedded scan cell 651. Additionally, providing signals ClockDR, ShiftDR, and UpdateDR instead of LSSD signals CaptureClock, ShiftClock, and UpdateClock respectively, enables LSSD-based scan- cells to use the invention. DR signals, together with signals RTI on line 7025 and TClock on line 7039, provide additional compliance signals. For example, in a Built-In-Self-Test (BIST) and RTI state, signal TClock, in accordance with the IEEE 1149.1 standard, provides BIST logic clocking during the RTI state, while signals UpdateDR, ShiftDR, and ClockDR provide the conventional signals update, shift, and clock, respectively. IR and DR signals provide compliance signals in accordance with the invention's second embodiment (FIG. 8B). Since TAP controller 702 performs all functions of a TAP controller 306, TAP 702 input and output signals are described in detail in the IEEE standard 1149.1.

Decoder and multiplexer 704, in addition to receiving TAP 702 output signals, receives mode control and conditioning signals on line 7011, and compliance control signals DR_State on line 7013, IR_State on line 7015, RTI_State on line 7017, Capture_State on line 7019, Shift_State on line 7021, and Update_State on line 7023. Applying an appropriate logic level (low, high, etc.) to a compliance control signal terminal activates the signal. The terminals for these compliance control signals are preferably internal, but may be external through cables, to the enabler 504 These compliance control signals are also preferably preset to a desired logic level when the enabler 504 is provided to a user. The DR_State signal selects a data state, the IR_State signal selects an instruction state, and the RTI_State signal selects an RTI state. In either a data state or an instruction state, the Capture_State signal selects a "clock," the Shift_State signal selects a "shift," and the Update_State signal selects an "update" action. For example, the two signals DR_State and Shift_State must be active to select the ShiftDR signal. Decoder and multiplexer 704, receiving appropriate selecting signals, may provide multiple output signals on line 7041.

Signal conditioning circuit 706 reshapes and translates decoder and multiplexer 704 output signal levels received on line 7041 to the proper logic levels and slew rate to drive a DUT. Circuit 706 receives mode control and conditioning signals on line 7011, including two mode control signals that control rising-edge clocking, falling-edge clocking, and pulse-mode clocking, as either positive or negative going pulses. Signal conditioning circuit 706 provides enabler 504 compliance signals on line 7043.

Enabler 504 operates in either a static or a dynamic mode. In the static mode, enabler 504 generates a predetermined set of compliance signals which can be used for more than one DUT. For example, if a signal UpdateDR is required, control signals are set so that signal UpdateDR always appears as one of the compliance signals on line 7043 to the DUTs. In the dynamic mode and during testing of a DUT, changing control signals permits compliance signals on line 7043 to have different functions to meet the needs of an ATE or in-circuit tester. For example, testing Central Processing Unit (CPU) DUTs requires two compliance signals on line 7043 while testing memory DUTs requires just one compliance signal on line 7043. Enabler 504 can dynamically provide compliance for both types of DUT upon changing setups from testing CPUs to testing memory.

FIG. 7B shows enabler 504 used in conjunction with an ICT interface. ICT bed-of-nails test fixture 802 includes enabler 504 and pin electronics 802-2. DUT 804 includes for illustrative purposes, three chips 804-2, 804-4, and 804-6, and boundary-test connector 8048. Pin electronics 802-2 and connector 804-8 serve as terminals for all boundary-scan test signals including both enabler 504 output signals and standard boundary-scan test signals TDI, TRST, TMS, TCK, and TDO. DUT 804, via pin electronics 802-2 and connector 8048, receives and provides the boundary-scan test signals. In this example, enabler 504 is easily transportable for testing different DUTs. Alternatively, PC-based boundary-scan test systems can use enabler 504 embedded inside cables (not shown) connected to connector 804-8.

Figure 8A:
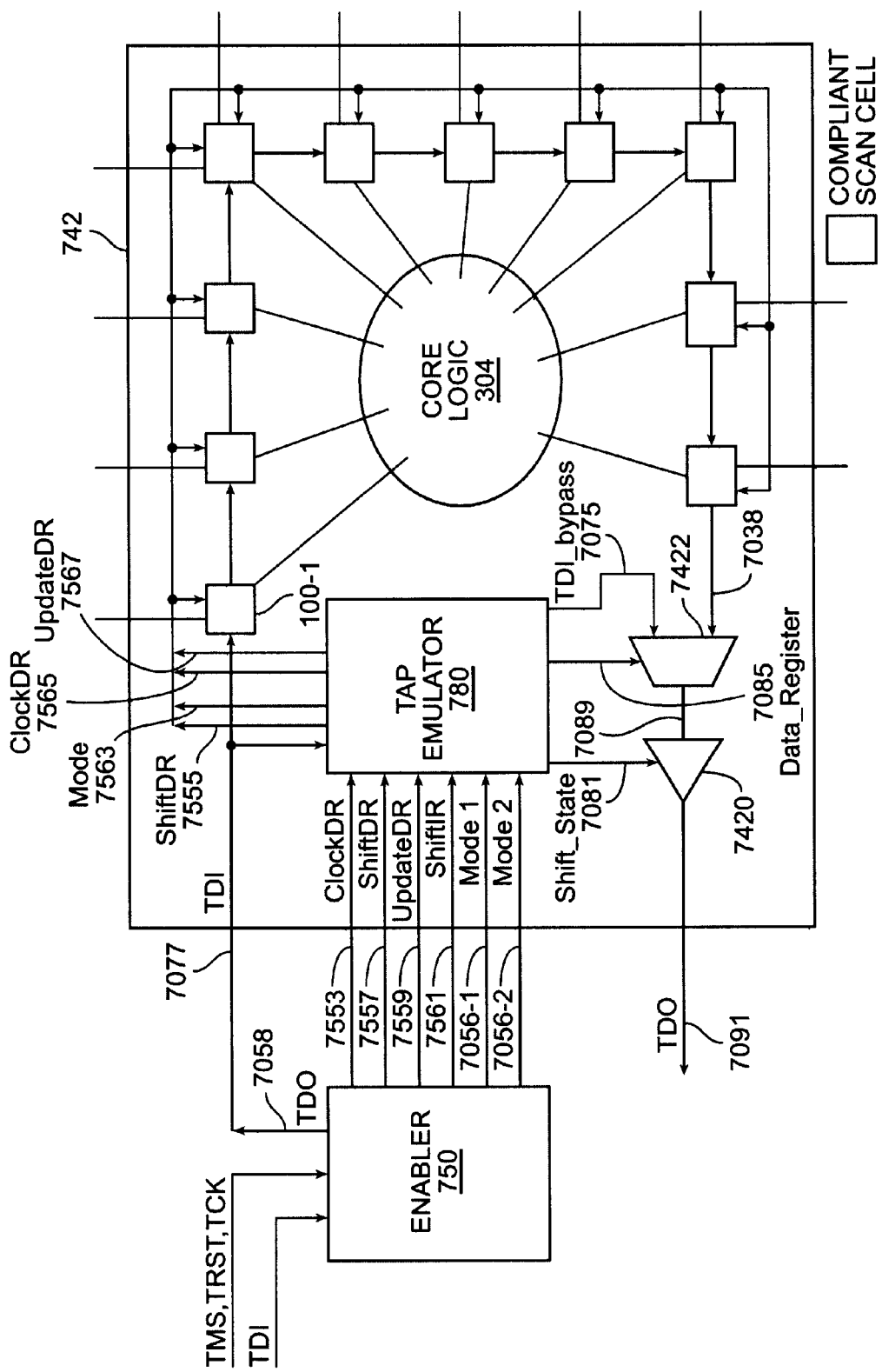
FIG. 8A shows a second embodiment of the invention using a second enabler, which works in conjunction with a TAP emulator and provides boundary scan testability to a TAP-less device.
Figure 8B:
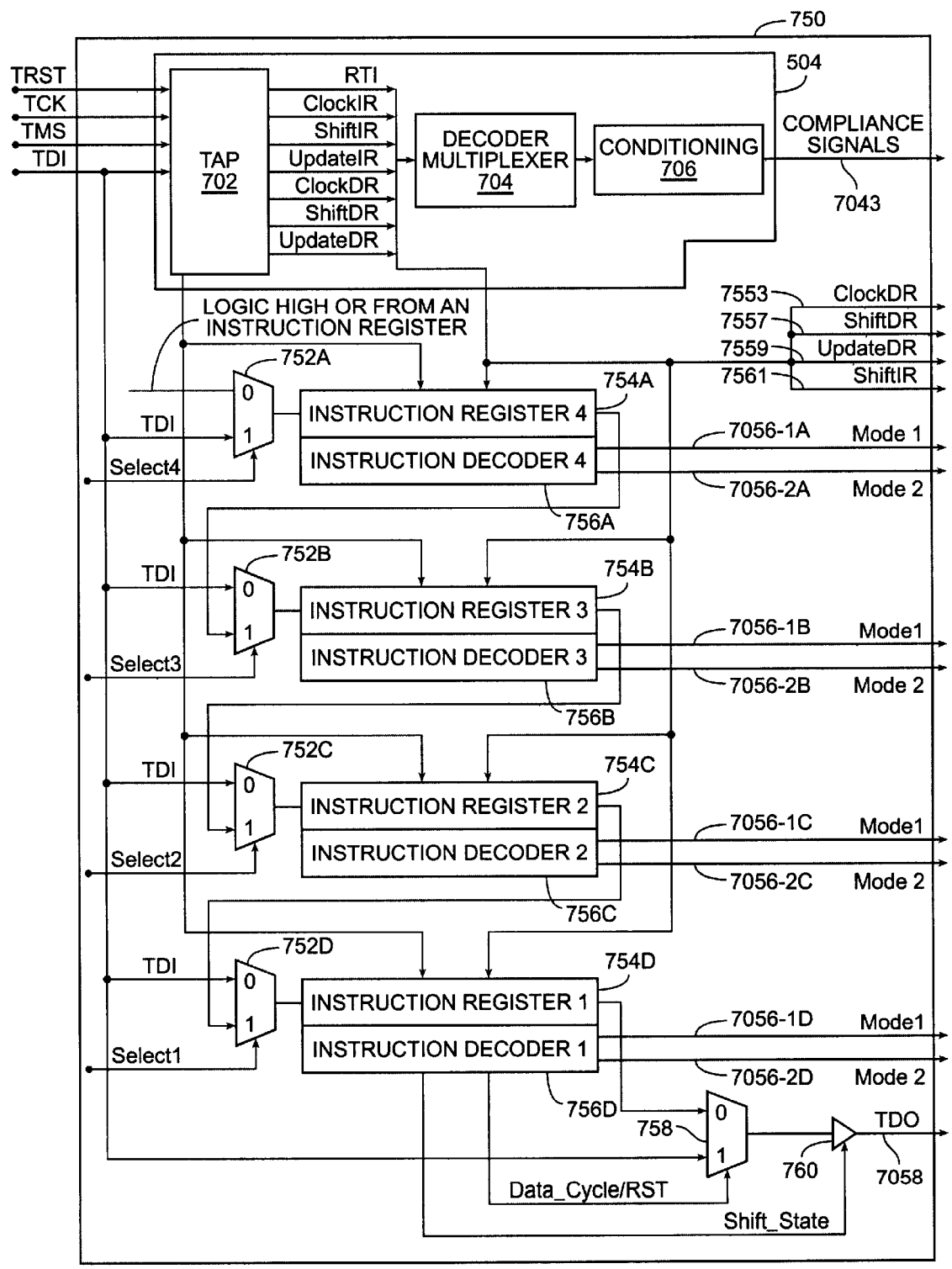
FIG. 8B shows the second enabler in accordance with a second preferred embodiment of the invention.

FIG. 8A shows a second embodiment of the invention using a second enabler 750, which works in conjunction with a TAP emulator 780 and provides boundary scan testability to a "TAP-less" DUT 742. TAP-less DUT 742 can be, for example, an insystem configurable (ISC) field programmable gate array (FPGA) or other type of programmable device that does not have an internal TAP controller due to either its nature or its limited size. TAP-less DUT 742 also includes compliant boundary scan cells 100, a buffer 7420, and a multiplexer 7422. Alternatively, buffer 7420 and/or multiplexer 7422 can be part of TAP emulator 780.

Enabler 750 receives, in accordance with the IEEE standard 1149.1, input signals TDI, TMS, TRST, and TCK.

Enabler 750 also outputs to TAP emulator 780 signal TDO on line 7058, compliance signals ClockDR on line 7553, ShiftDR on line 7557, UpdateDR on line 7559, and ShiftIR on line 756 1, and mode signals Mode 1 on line 7056-1 and Mode 2 on line 7056-2.

TAP emulator 780 emulates signals that would normally be provided by an IEEE standard 1149.1 TAP controller 306. TAP emulator 780 receives enabler 750 output signals and provides emulator output signals ShiftDR on line 7555, Mode on line 7563, ClockDR on line 7565, and UpdateDR on line 7567 to cells 100, signal Shift_State on line 7081 to buffer 7420, signal Data_Register on line 7085 as a select control to multiplexer 7422, and signal TDI_bypass on line 7075 to multiplexer 7422. Signal TDI_bypass on line 7075 is signal TDI bypassing scan cells 100 and can be either signal TDI on line 7077 or signal TDI going through a bypass register (FIG. 8C). Signal Data_Register on line 7085 permits selecting TDI bypass on line 7075 or TDI going through cells 100 on line 7038. TAP emulator 780, preferably inside a TAP-less DLJT 742, is about one-tenth the size of an IEEE standard 1149.1 TAP, and greatly reduces gate overhead.

The first boundary scan cell 100-1 in the boundary scan chain receives enabler 750 signal TDO on line 7058 as signal TDI on line 7077. All boundary scan cells 100 receive, from enabler 750 through TAP emulator 780, shift control signal ShiftDR on line 7555 for signal shift_dr (FIG. 1), signal Mode on line 7563 for signal mode, signal ClockDR on line 7565 for signal shift_dr, and signal UpdateDR on line 7567 for signal update_clk.

Multiplexer 7422 allows selection of either TDI on line 7038 from the scan chain or TDI_bypass on line 7075 to provide, through line 7089 and buffer 7420, signal TDO on line 7091.

Buffer 7420 buffers signals on line 7089 to provide the scan chain TDO signal on line 7091. A signal Shift_State on line 7081, received from TAP emulator 780, controls buffer 7420.

FIG. 8B shows a preferred embodiment of FIG. 8A enabler 750, including a compliance enabler 504 of FIG. 7A and supporting circuitry for TAP-less DUTs 742 of FIG. 8A. Enabler 750 includes, for illustrative purposes, four multiplexers 752, four instruction registers 754, four instruction decoders 756, and four signal pairs Mode 1 on line 7056-1 and Mode 2 on line 7056-2, indicating support for four TAP-less DUTs 742. Each addition of a multiplexer 752, an instruction register 754, an instruction decoder 756, and-thus a signal pair Mode 1 one line 7056-1 and Mode 2 on line 7056-2 supports each additional TAP-less DUT 742. Consequently, one FIG. 8A DUT 742 requires only one multiplexer 752, one instruction register 754, one instruction decoder 756, and one signal pair Mode 1 on line 7056-1 and Mode 2 on line 7056-2. Enabler 750 also includes a multiplexer 758, and a buffer 760.

In addition to the same input signals to enabler 504, enabler 750 receives select signals (Select 1-4), which are activated at appropriate logic levels (low, high, etc.). In the preferred embodiment the select signal terminals are internal to the enabler 750. Alternatively, these terminals, provided through cables, can be external to enabler 750. The select signals are preferably preset to a logic level when the enabler 750 is provided to a user. Enabler 750 output signals include ClockDR-on line 7553, ShiftDR on line 7557, UpdateDR on line 7559, ShiftIR on line 7561, Mode 1 on lines 7056-1A through 7056-ID, Mode 2 on lines 7056-2A through 7056-2D, and TDO on line 7058. Because enabler 750 includes an enabler 504, enabler 750 can provide compliance signals on line 7043 (FIG. 7A) to support non-compliant DUTs that work with enabler 504. Those skilled in the art will recognize that if compliance signals on line 7043 are not needed, then the circuitry for decoding and multiplexing (704), and conditioning (706) can be removed.

Multiplexers 752 permit selecting either TDI or TDI that has been transformed by TAP 702 and stored in instruction register 754.

Instruction registers 754 store instruction signals preferably in OP CODE form (FIG. 8D) received from signal TDI.

Instruction decoders 756 decode instruction signals in instruction registers 754 to provide signals Mode 1 and Mode 2. Since enabler 750 supports all IEEE standard 1149.1 public instructions including the four instructions EXTEST, SAMPLE/PRELOAD, BYPASS (or TAP RESET), and USER MODE, the instruction OP CODEs (FIG. 8D) include four logic values and thus require two encoding signals Mode 1 and Mode 2. Additional instructions require additional encoding signals. Those skilled in the art will recognize that n signals encode $2^n$ states, each for one instruction.

Signals Mode 1 and Mode 2 carry instruction information, and signals ClockDR, ShiftDR, UpdateDR, and ShiftIR carry clocking signals, to the TAP emulator 780, which in turn provides these instruction and clocking signals to cells 100 (FIG. 8A).

Multiplexer 758 allows bypassing the TAP-less support circuitry, that is, a signal TDI arriving at compliance enabler 750 can be output unchanged. A signal Data_Cycle/RST, received from instruction decoder 756D, controls multiplexer 758. Buffer 760 receives a Shift_State control signal from instruction decoder 756D to act as a signal driver.

One enabler 750 supports one chain of preferably consecutive TAP-less DUTs 742, i.e., adjacent each other in a chain. If the DUTs 742 are not consecutive then an additional enabler 750 must be provided. Further, the TAP-less DUT 742 chain is preferably at the beginning or ending of a boundary-scan chain. If a TAP-less DUT 742 were in the middle of a boundary-scan chain, then the chain would have to be cut to insert the TAP-less DUT 742 (or DUT chain) into the boundary-scan chain.

FIG. 8C shows the preferred embodiment of FIG. 8A TAP emulator 780, including a decoder 782, a bypass register 784, and a multiplexer 786. TAP emulator 780 receives signals output from enabler 750, including signals ClockDR on line 7553, ShiftDR on line 7557, UpdateDR on line 7559, ShiftIR on line 7561, Mode 1 on line 7056-1, and Mode 2 on line 7056-2. Since signals Mode 1 and Mode 2 carry instructions, there is no need to provide separate instruction registers. Signal Mode 1 and signal Mode 2 control the "mode" bit of the boundary-scan cell 100. They also determine signal TDO from a signal TDI path (whether signal TDI is output unchanged, going through the boundary scan chain, etc.). Signal ShiftIR on line 7087 selects signal TDI either on line 7077 unchanged or through the bypass register 784 on line 7073, to appear on line 7075.

Decoder 782 output signals ShiftDR on line 7555, Mode on line 7563, ClockDR on line 7565, and UpdateDR on line 7567 carry decoded instructions to the scan cells 100. Decoder 782 also produces output signals Shift_State on line 7081 and Data_Register on line 7085. FIG. 8D is a table showing mode bit decoding. Pursuant to the EEE standard 1149.1, signal TDI provides the instruction OP CODEs when signal TMS is selected for instruction states. Instruction OP CODEs determine signal TDO from signal TDI in data states going though different paths. If signal Mode 1 is at logic high level (1) and signal Mode 2 is at logic low level (0), instruction OP CODE logic value 10, received from signal TDI in two consecutive clock cycles, selects USER MODE in which a user defines signal TDO from a signal TDI path. For example, a user can define, in FIG. 8A, a signal TDI path that starts from line 7077, passes through TAP emulator 780, and appears as signal TDI_bypass on line 7075. Alternatively, the TDI path can start from line 7077, pass through all cells 100 that form the entire scan chain, and appear on line 7038, or start from line 7077, pass through some scan cells 100, core logic 304, some additional scan cells 100, and appear on line 7038. Signal TDI, either on line 7038 or on line 7075 as TDI_bypass, passes through multiplexer 7422 and buffer 7420, and appears as signal TDO on line 7091. Further, a user can define, in FIG. 8C, a TDI path that starts from line 7077, passes through bypass register 784 and multiplexer 786, and appears as signal TDI_bypass on line 7075. If both signals Mode 1 and Mode 2 are at logic high (11), signal TDI (or instruction OP CODE) value 11 selects a bypass instruction so that signal TDI passes through bypass register 784 and multiplexer 786, and appears as signal TDI_bypass on line 7075 (bypass register state). If signal Mode 1 is at logic low and signal Mode 2 is at logic high, or if both signals Mode 1 and Mode 2 are at logic low, then both TDI values 01 and 00 select boundary-scan scan registers so that signal TDI on line 7077 passes through the boundary scan cells 100, appears on line 7038 (FIG. 8A), passes through multiplexer 7422 and buffer 7420, and appears as signal TDO on line 7091 (data register state).

FIG. 8E shows a preferred embodiment of FIG. 8C decoder 782, including a NOR gate 852, an AND gate 854, and two OR gates 856 and 858. NOR gate 852 receives two signals Mode 1 on line 7056_1 and Mode 2 on line 7056-2, and produces a NOR gate output signal on line 8005, which appears outside of decoder 782 as signal Mode on line 7563. AND gate 854 also receives the two signals Mode 1 and Mode 2, and produces AND gate output signal on line 8003. OR gate 856 receives signals ShiftDR on line 7559 and ShiftIR on line 7561 to produce signal Shift State (FIG. 8C) on line 7081. OR gate 858 receives signals on lines 8003 and 8005 to produce signal Data Register on line 7085. Signal ShiftIR on line 7561, beside feeding to OR gate 856, appears unchanged as signal ShiftIR on line 7087. Input signals ClockDR on line 7553, UpdateDR on line 7557, and ShiftDR on line 7559 appear unchanged as ClockDR on line 7565, UpdateDR on line 7567, and ShiftDR on line 7555, respectively. Decoder 782 provides signals ShiftDR on line 7555, Mode on line 7563, ClockDR on line 7565, and UpdateDR on line 7567 to boundary scan cells 100 (FIG. 8A). Decoder 782 also provides signal Shift_State on line 7081 to buffer 7420 (FIG. 8A) and signal Data Register on line 7085 to multiplexer 7422 (FIG. 8A).

Using an enabler 750 can avoid redundant circuitry. For example, enabler 750 implemented in an ASIC DUT allows many signals (ClockDR, UpdateDR, etc.) to be used with functional signals in the DUTs during boundary-scan test mode to form enabler 504 compliance signals. In another example, existing compliant signal UpdateDR from enabler 504 for embedded scan cells 502 can be used in enabler 750 to provide testability for a TAP-less DUT. In utilizing the invention's two enablers 504 and 750, a DUT may vary as follows: 1) lack of an internal TAP 306; 2) presence of a TAP 306 and both regular boundary-scan cells 100 and embedded scan cells 502; or 3) presence of only embedded scan cells 502 and presence or not of a TAP 306.

Figure 9:
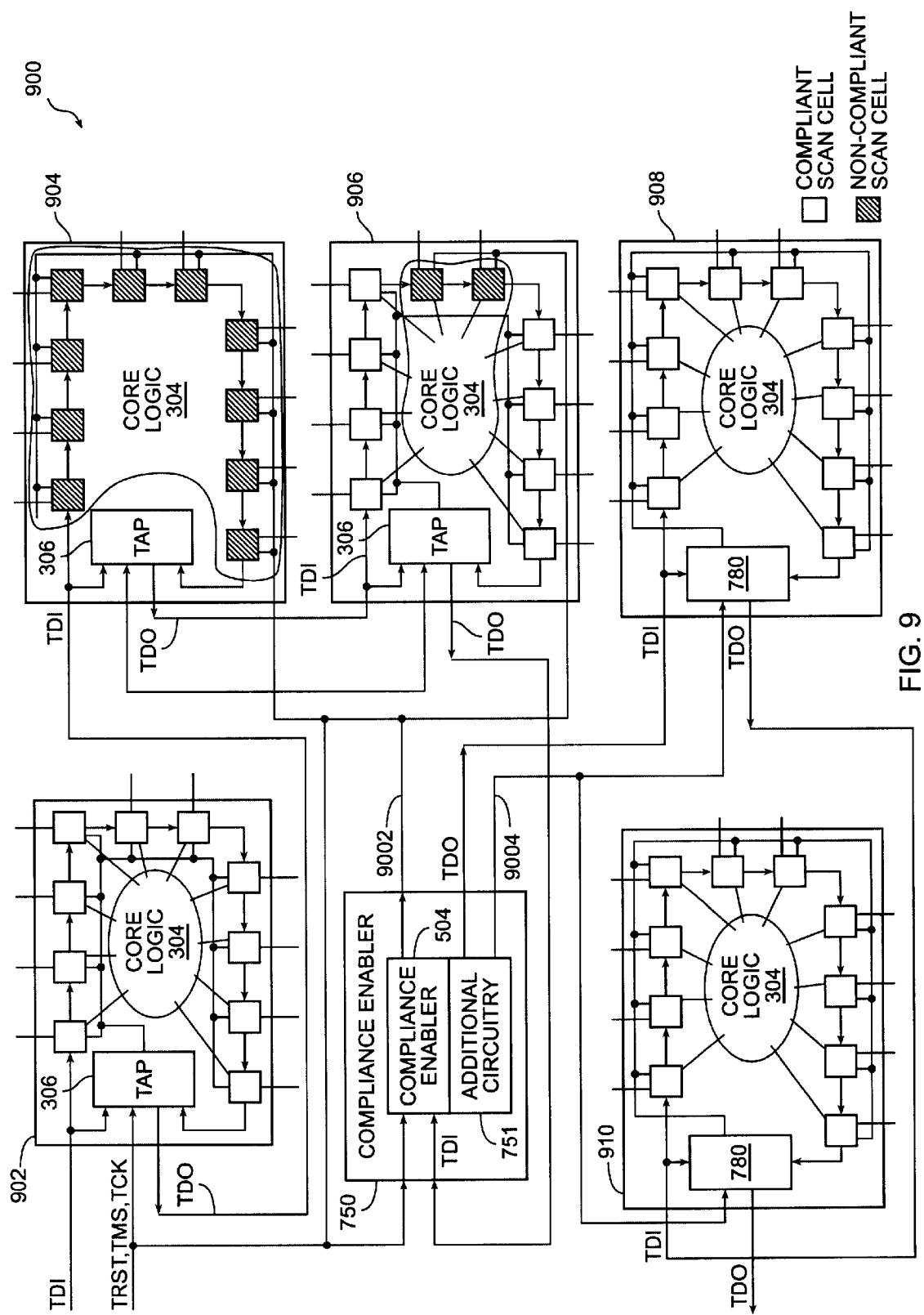
FIG. 9 shows two different embodiments of enablers providing compliance signals to various types of DUT.

FIG. 9 shows a scan chain system 900 utilizing an enabler 750 that includes an enabler 504 and additional circuitry 751 for supporting TAP-less devices. System 900 includes chips 902, 904, 906, 908, and 910 forming a scan chain using conventional scan signals TCK, TMS, TRST, TDI, and TDO. Chip 902 includes a TAP 306 and all compliant boundary-scan cells, and therefore does not need compliance signals from either enabler 504 or enabler 750. Chip 904 includes a TAP 306 and all non-compliant scan cells 502. Chip 906 includes a TAP 306 and two non-compliant scan cells 502. Chips 904 and 906, because they include non-compliant scan cells 502, receive compliance signals on line 9002 from enabler 504. Because chips 908 and 910 do not have a TAP 306, each includes a TAP emulator 780 and receives scan control signals Mode 1, Mode 2, ClockDR, ShiftDR, UpdateDR, and ShiftIR on line 9004 from enabler 750.

The invention has been explained above with reference to two preferred embodiments. Other embodiments will be apparent to those skilled in the art after reading this disclosure. These and other variations upon the preferred embodiment are intended to be covered by the following claims.

What is claimed is:

1. A method for providing devices compliant with the IEEE boundary-scan standard 1149.1, comprising the steps of:

providing a device having one or more scan cells not compliant with said standard;

providing an enabler; and providing compliance signals through said enabler to said scan cells.

2. The method of claim 1, wherein said compliance signals are based on a state of a test access port (TAP) of the standard.

3. A method for providing devices that function in compliance with a standard defining test logic that can be used with integrated circuits with boundary scan architecture using internal architecture that is not compliant with the standard, the method comprising:

providing a device having one or more non-compliant scan cells having an internal architecture that is not compliant with the standard;

providing an enabler; and providing compliance signals through said enabler to said scan cells.

4. The method of claim 3, wherein said non-compliant scan cells are embedded within said device.

5. The method of claim 4, wherein said non-compliant scan cells are embedded within core logic of said device.

6. The method of claim 4, wherein said non-compliant scan cells comprise internal scan cells in said device.

7. The method of claim 3, wherein said enabler is outside of said device and said device is a Device Under Test (DUT).

8. The method of claim 3, wherein said enabler comprises:

a TAP controller for providing TAP controller signals; and decoding and multiplexing circuitry for receiving said TAP controller signals and for providing decoding and multiplexing signals.

9. The method of claim 8, wherein said enabler further comprises conditioning circuitry for receiving said decoding and multiplexing signals and for providing said compliance signals.

10. A method for reproducing the functions of a TAP controller in compliance with a standard defining test logic that can be used with integrated circuits with boundary scan architecture in a device not having a TAP controller in compliance with the standard, the method comprising:

providing at least one device without a TAP controller;
coupling a TAP emulator to said device;
providing an enabler; and
providing compliance signals through said enabler to said TAP emulator.

11. The method of claim 10, wherein said enabler comprises:
a TAP controller for providing TAP controller signals; and
scan control circuitry for receiving said TAP controller signals and for providing scan control signals;
wherein said controller signals and said scan control signals provide said compliance signals.

12. The method of claim 11, wherein said compliance signals support instructions in compliance with the standard.

13. The method of claim 10, wherein said TAP emulator is disposed in said device.

14. A system that functions in compliance with a standard defining test logic that can be used with integrated circuits with boundary scan architecture using internal architecture that is not in compliance with the standard, the system comprising:
one or more non-compliant scan cells, in a device, that have an internal architecture that does not comply with the standard; and
an enabler for providing compliance signals to said scan cells;
wherein said scan cells and said enabler enable compliance with the standard.

15. The system of claim 14, wherein said non-compliant scan cells are disposed in said device.

16. The system of claim 15, wherein said non-compliant scan cells are disposed in core logic in said device.

17. The system of claim 14, wherein said non-compliant scan cells comprise internal scan cells in said device.

18. The system of claim 14, wherein said compliance signals are based on a state of a TAP in compliance with the standard.

19. The system of claim 14, wherein said enabler is external to said device.

20. The system of claim 14, wherein said enabler comprises:
a TAP controller for providing TAP controller output signals; and
decoding and multiplexing circuitry for receiving TAP controller output signals and for outputting decoding and multiplexing signals.

21. The system of claim 20, wherein said enabler further comprises conditioning circuitry for receiving said decoding and multiplexing output signals and for providing said compliance signals.

22. A system in compliance with a standard defining test logic that can be used with integrated circuits with boundary scan architecture, the system comprising:
at least one device without a TAP controller;
a TAP emulator coupled to said device; and
an enabler providing scan control signals to said TAP emulator;
wherein said emulator and said enabler enable compliance with said standard.

23. The system of claim 22, wherein said enabler comprises:
a TAP controller for providing TAP controller output signals; and
scan control circuitry for receiving said TAP controller output signals and for providing scan control output signals;
wherein said controller output signals and said scan control output signals provide said compliance signals.

24. The system of claim 23, wherein said compliance signals support instructions in compliance with the standard.

25. The system of claim 22, wherein said TAP emulator is internal to said device.

26. An apparatus comprising:
a test access port (TAP) adapted to provide TAP output compliance signals;
multiplexing and decoding circuitry adapted to receive said TAP output compliance signals and to provide said TAP output compliance signals for an embedded boundary scan testing architecture; and
scan control circuitry for receiving said TAP output signals for use with a TAP emulator, wherein said apparatus enabler compliance with the standard.

27. A method for testing a device with internal architecture that is not compliant with a standard defining test logic that can be used with integrated circuits with boundary scan architecture by supplementing the internal architecture with external architecture so that the external architecture and the internal architecture cooperate to provide testing compliant with the standard, the method comprising:
providing a device on a chip including one or more non-compliant scan cells having an internal architecture that is not compliant with the standard;
providing an enabler external to said chip; and
providing compliance signals through said enabler to said scan cells;
wherein said compliance signals and said enabler compliance with said standard using said scan cells.

28. A method for reproducing the functions of a TAP controller compliant with a standard defining test logic that can be used with integrated circuits with boundary scan architecture in a device not having a TAP controller compliant with the standard, the method comprising:
providing at least one device on a chip without a TAP controller compliant with the standard;
coupling a TAP emulator to said device; providing an enabler external to said chip; and
providing compliance signals through said enabler to said TAP emulator;
wherein said compliance signals, said emulator, and said enabler enable the TAP emulator to emulate the function of a TAP controller compliant with the standard.

29. A system for testing a device with internal architecture that is not compliant with a standard defining test logic that can be used with integrated circuits with boundary scan architecture by supplementing the internal architecture with external architecture so that the external and internal architectures cooperate to provide testing that is compliant with the standard, the system comprising:
one or more non-compliant scan cells, on a chip, that have an internal architecture that does not comply with said standard; and
an enabler external to said chip providing compliance signals to said scan cells;
wherein said scan cells, said compliance signals, and said enabler enable compliance with said standard.

30. A system for supplementing a testing system having a device with internal architecture that is not compliant with a standard defining test logic that can be used with integrated circuits with boundary scan architecture by supplementing the internal architecture of the testing system with external architecture so that the external and internal architectures are capable of cooperating to provide testing that is compliant with the standard, the system comprising:

at least one device without a TAP controller compliant with the standard;

a TAP emulator coupled to said device;

an enabler providing scan control signals to said TAP emulator;

wherein said emulator and said enabler enable the emulator to emulate a TAP controller compliant with the standard.

31. A method for operating a device that functions in compliance with a standard defining test logic that can be used with integrated circuits with boundary scan architecture using internal architecture that is not compliant with the standard, the internal architecture having one or more non-compliant scan cells and a TAP controller, the method comprising:

receiving signals from the internal architecture at a compliance enabler; and synchronizing a TAP controller internal to the compliance enabler with the TAP controller of the internal architecture.

32. The method of claim 31, wherein said signals comprise TDI, TMS, TRST, and TCK signals.

33. The method of claim 31, further comprising:

generating control signals based on states of said TAP controller internal to the compliance enabler.

34. A compliance enabler for operating a device that functions in compliance with a standard defining test logic that can be used with integrated circuits with boundary scan architecture using internal architecture that is not compliant with the standard, the internal architecture having one or more non-compliant scan cells and a TAP controller, the compliance enabler comprising:

a signal receiving module designed to receive signals from the internal architecture;

a TAP controller internal to the compliance enabler; and a TAP controller synchronization module designed to synchronize said TAP controller internal to the compliance enabler with the TAP controller of the internal architecture.

35. The compliance enabler of claim 34, wherein said signals comprise TDI, TMS, TRST, and TCK signals.

36. The compliance enabler of claim 34, further comprising:

a control signal generation module designed to generate control signals based on states of said TAP controller internal to the compliance enabler.

37. An apparatus for operating a device that functions in compliance with a standard defining test logic that can be used with integrated circuits with boundary scan architecture using internal architecture that is not compliant with the standard, the internal architecture having one or more non-compliant scan cells and a TAP controller, the apparatus comprising:

means for receiving signals from the internal architecture at a compliance enabler; and means for synchronizing a TAP controller internal to the compliance enabler with the TAP controller of the internal architecture.

38. The apparatus of claim 37, wherein said signals comprise TDI, TMS, TRST, and TCK signals.

39. The apparatus of claim 37, further comprising:

means for generating control signals based on states of said TAP controller internal to the compliance enabler.

40. A program storage device readable by a machine, tangibly embodying a program of instructions executable by the machine to perform a method for operating a device that functions in compliance with a standard defining test logic that can be used with integrated circuits with boundary scan architecture using internal architecture that is not compliant with the standard, the internal architecture having one or more non-compliant scan cells and a TAP controller, the method comprising:

receiving signals from the internal architecture at a compliance enabler; and synchronizing a TAP controller internal to the compliance enabler with the TAP controller of the internal architecture.

* * * * *

UNITED STATES PATENT AND TRADEMARK OFFICE
CERTIFICATE OF CORRECTION

PATENT NO.   : 6,560,739 B1
DATED        : May 6, 2003
INVENTOR(S)  : Sung Soo Chung It is certified that error appears in the above-identified patent and that said Letters Patent is hereby corrected as shown below:

Drawings,
Sheet 11 of 12, Figure 8E, the first occurrence of "858" should be changed to -- 856 -- as follows:

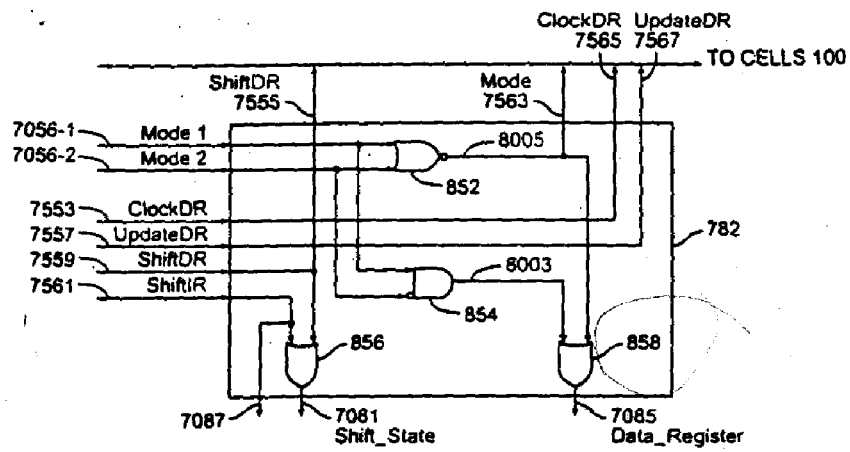

FIG. 8E

Column 1,
Line 56, replace "update_clk and mode." with -- update_clk, and mode. --.
Line 62, replace "signal output" with -- signal_output --.
Line 64, replace "serial input" with -- serial_input --.
Lines 65 and 66, replace "serial output" with -- serial_output --.

Column 2,
Line 3, replace "serial output" with -- serial_output --.
Line 4 and 10, replace "serial input" with -- serial_input --.
Line 41, replace "TCK through" with -- TCK, through --.
Line 52, replace "IEEEE" with -- IEEE --.
Line 64, replace "AND OR" with -- AND and OR --.

Column 4,
Line 14, replace "embedded-boundary-scan" with -- embedded boundary-scan --.

Column 6,
Line 39, replace "sys_lk, j_shift and" with -- sys_clk, j_shift and --.
Line 67, replace "602,." with -- 602, --.

UNITED STATES PATENT AND TRADEMARK OFFICE
CERTIFICATE OF CORRECTION

PATENT NO. : 6,560,739 B1
DATED : May 6, 2003
INVENTOR(S) : Sung Soo Chung

It is certified that error appears in the above-identified patent and that said Letters Patent is hereby corrected as shown below:

Column 7,
Line 26, replace "ClockiR" with -- ClockIR --.

Column 8,
Line 3, replace "504" with -- 504. --.
Lines 44 and 49, replace "8048" with -- 804-8 --.
Line 58, replace "insystem" with -- in-system --.

Column 9,
Line 18, replace "TDI bypass" with -- TDI_bypass --.
Line 20, replace "DLJT" with -- DUT --.
Line 47, replace "and-thus" with -- and thus --.
Line 65, replace "7056-ID" with -- 7056-1D --.

Column 10,
Line 63, replace "EEE" with -- IEEE --.

Column 11,
Line 34, replace "7056_1" with -- 7056-1 --.
Line 40, replace "Shift State" with -- Shift_State --.
Line 42 and 52, replace "Data Register" with -- Data_Register --.

Signed and Sealed this

Seventeenth Day of August, 2004

JON W. DUDAS
*Acting Director of the United States Patent and Trademark Office*